United States Patent
Jang et al.

(10) Patent No.: US 11,442,810 B2
(45) Date of Patent: Sep. 13, 2022

(54) MEMORY AND OPERATION METHOD OF MEMORY

(71) Applicant: SK hynix Inc., Gyeonggi-do (KR)

(72) Inventors: Munseon Jang, San Jose, CA (US); Hoiju Chung, San Jose, CA (US); Jang Ryul Kim, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/330,881

(22) Filed: May 26, 2021

(65) Prior Publication Data

US 2021/0397516 A1 Dec. 23, 2021

Related U.S. Application Data

(60) Provisional application No. 63/042,193, filed on Jun. 22, 2020, provisional application No. 63/094,415, filed on Oct. 21, 2020.

(51) Int. Cl.
  *G06F 11/10* (2006.01)
  *H03M 13/00* (2006.01)
(52) U.S. Cl.
  CPC ....... *G06F 11/1076* (2013.01); *H03M 13/616* (2013.01)

(58) Field of Classification Search
  None
  See application file for complete search history.

(56) References Cited

U.S. PATENT DOCUMENTS

| 2016/0048425 | A1* | 2/2016 | Kim | G06F 11/1048 |
|---|---|---|---|---|
| | | | | 714/764 |
| 2020/0097360 | A1 | 3/2020 | Lu | |
| 2020/0142771 | A1 | 5/2020 | Cho et al. | |

* cited by examiner

*Primary Examiner* — Phung M Chung
(74) *Attorney, Agent, or Firm* — IP & T Group LLP

(57) ABSTRACT

A memory includes: a memory core including sequentially disposed N data cell regions and an ECC cell region respectively suitable for storing N data pieces of K bits and a corresponding ECC of M bits; and an error correction circuitry suitable for generating the ECC based on the data pieces and error-correcting the data pieces based on the ECC, through a check matrix configured by a message part of a [M×(K*N)] bit-dimension and an ECC part of a [M×M] bit-dimension, wherein the message part includes N characteristic indicator groups of a [M/2×K] bit-dimension, respectively corresponding to the data pieces, and each including K indicators of a [M/2×1] bit-dimension and having the same value, and wherein a hamming distance between the indicators respectively corresponding to the data pieces stored in neighboring ones among the data cell regions is 1 or M/2.

17 Claims, 11 Drawing Sheets

FIG. 2

| DATA | | | | | | | | ECC | | | |
|----|----|----|----|----|----|----|----|----|----|----|----|
| D0 | D1 | D2 | D3 | D4 | D5 | D6 | D7 | E0 | E1 | E2 | E3 |
| 1 | 1 | 1 | 0 | 1 | 1 | 1 | 1 | 1 | 0 | 0 | 0 |
| 1 | 1 | 0 | 1 | 1 | 0 | 0 | 1 | 0 | 1 | 0 | 0 |
| 1 | 0 | 1 | 1 | 0 | 1 | 0 | 1 | 0 | 0 | 1 | 0 |
| 0 | 1 | 1 | 1 | 0 | 0 | 1 | 1 | 0 | 0 | 0 | 1 |

FIG. 3

| DATA | | | | | | | | ECC | | | |
|---|---|---|---|---|---|---|---|---|---|---|---|
| D0 | D1 | D2 | D3 | D4 | D5 | D6 | D7 | E0 | E1 | E2 | E3 |
| 1*D0 | 1*D1 | 1*D2 | 0*D3 | 1*D4 | 1*D5 | 1*D6 | 1*D7 | 1*E0 | 0*E1 | 0*E2 | 0*E3 |
| 1*D0 | 1*D1 | 0*D2 | 1*D3 | 1*D4 | 0*D5 | 0*D6 | 1*D7 | 0*E0 | 1*E1 | 0*E2 | 0*E3 |
| 1*D0 | 0*D1 | 1*D2 | 1*D3 | 0*D4 | 1*D5 | 0*D6 | 1*D7 | 0*E0 | 0*E1 | 1*E2 | 0*E3 |
| 0*D0 | 1*D1 | 1*D2 | 1*D3 | 0*D4 | 0*D5 | 1*D6 | 1*D7 | 0*E0 | 0*E1 | 0*E2 | 1*E3 |

| DATA | | | | | | | | ECC | | | |
|---|---|---|---|---|---|---|---|---|---|---|---|
| 1 | 1 | 0 | 0 | 1 | 0 | 1 | 0 | 0 | 1 | 1 | 0 |
| 1*1 | 1*1 | 1*0 | 0*0 | 1*1 | 1*0 | 1*1 | 1*0 | 1*0 | 0*1 | 0*0 | 0*0 |
| 1*1 | 1*1 | 0*0 | 1*0 | 1*1 | 0*0 | 0*1 | 1*0 | 0*0 | 1*1 | 0*0 | 0*0 |
| 1*1 | 0*1 | 1*0 | 1*0 | 0*1 | 1*0 | 0*1 | 1*0 | 0*0 | 0*1 | 1*1 | 0*0 |
| 0*1 | 1*1 | 1*0 | 1*0 | 0*1 | 0*0 | 1*1 | 1*0 | 0*0 | 0*1 | 0*0 | 1*0 |

| DATA | | | | | | | | ECC | | | |
|---|---|---|---|---|---|---|---|---|---|---|---|
| 1 | 1 | 0 | 0 | 1 | 0 | 0 | 0 | 0 | 1 | 1 | 0 |
| 1*1 | 1*1 | 1*0 | 0*0 | 1*1 | 1*0 | 1*0 | 1*0 | 1*0 | 0*1 | 0*0 | 0*0 |
| 1*1 | 1*1 | 0*0 | 1*0 | 1*1 | 0*0 | 0*0 | 1*0 | 0*0 | 1*1 | 0*0 | 0*0 |
| 1*1 | 0*1 | 1*0 | 1*0 | 0*1 | 1*0 | 0*0 | 1*0 | 0*0 | 0*1 | 1*1 | 0*0 |
| 0*1 | 1*1 | 1*0 | 1*0 | 0*1 | 0*0 | 1*0 | 1*0 | 0*0 | 0*1 | 0*0 | 1*0 |

| DATA | | | | | | | | ECC | | | |
|---|---|---|---|---|---|---|---|---|---|---|---|
| 0 | 1 | 0 | 1 | 1 | 0 | 1 | 0 | 0 | 1 | 1 | 0 |
| 1*0 | 1*1 | 1*0 | 0*1 | 1*1 | 1*0 | 1*1 | 1*0 | 1*0 | 0*1 | 0*0 | 0*0 |
| 1*0 | 1*1 | 0*0 | 1*1 | 1*1 | 0*0 | 0*1 | 1*0 | 0*0 | 1*1 | 0*0 | 0*0 |
| 1*0 | 0*1 | 1*0 | 1*1 | 0*1 | 1*0 | 0*1 | 1*0 | 0*0 | 0*1 | 1*1 | 0*0 |
| 0*0 | 1*1 | 1*0 | 1*1 | 0*1 | 0*0 | 1*1 | 1*0 | 0*0 | 0*1 | 0*0 | 1*0 |

| DATA | | | | | | | | ECC | | | |
|---|---|---|---|---|---|---|---|---|---|---|---|
| 1 | 1 | 1 | 0 | 1 | 0 | 1 | 1 | 0 | 1 | 1 | 0 |
| 1*1 | 1*1 | 1*1 | 0*0 | 1*1 | 1*0 | 1*1 | 1*1 | 1*0 | 0*1 | 0*0 | 0*0 |
| 1*1 | 1*1 | 0*1 | 1*0 | 1*1 | 0*0 | 0*1 | 1*1 | 0*0 | 1*1 | 0*0 | 0*0 |
| 1*1 | 0*1 | 1*1 | 1*0 | 0*1 | 1*0 | 0*1 | 1*1 | 0*0 | 0*1 | 1*1 | 0*0 |
| 0*1 | 1*1 | 1*1 | 1*0 | 0*1 | 0*0 | 1*1 | 1*1 | 0*0 | 0*1 | 0*0 | 1*0 |

| DQ0_Group | DQ1_Group | DQ2_Group | DQ3_Group | DQ4_Group | DQ5_Group | DQ6_Group | DQ7_Group |
|---|---|---|---|---|---|---|---|
| 0 | 1 | 1 | 1 | 0 | 0 | 0 | 1 |
| 0 | 0 | 0 | 1 | 1 | 1 | 1 | 0 |
| 1 | 1 | 0 | 0 | 1 | 1 | 0 | 1 |
| 1 | 1 | 1 | 1 | 0 | 1 | 1 | 0 |

FIG. 11

| DQ0_Group | DQ1_Group | DQ2_Group | DQ3_Group | DQ4_Group | DQ5_Group | DQ6_Group | DQ7_Group |
|---|---|---|---|---|---|---|---|
| 0 | 1 | 1 | 0 | 0 | 0 | 1 | 1 |
| 0 | 0 | 0 | 1 | 1 | 1 | 0 | 1 |
| 1 | 1 | 0 | 1 | 1 | 0 | 1 | 1 |
| 1 | 1 | 1 | 0 | 1 | 1 | 0 | 0 |

MEMORY AND OPERATION METHOD OF MEMORY

CROSS-REFERENCE TO RELATED APPLICATIONS

The present application claims priority to U.S. Provisional Application No. 63/042,193 filed on Jun. 22, 2020 and U.S. provisional Application No. 63/094,415 filed on Oct. 21, 2020, which are incorporated herein by reference in their entirety.

BACKGROUND

1. Field

Various embodiments of the present invention relate to a memory, and more particularly, to error correction of a memory.

2. Description of the Related Art

In the early stage of a semiconductor memory device industry, there were many originally good dies on the wafers, which means that memory chips were produced with no defective memory cells through a semiconductor fabrication process. However, as the capacity of memory devices increases, it becomes difficult to fabricate a memory device that does not have any defective memory cell. Currently, it may be said that there is substantially no chance that a memory device can be fabricated without any defective memory cells. To address this issue, a repair method of replacing defective memory cells with redundant memory cells is being used.

As another method, an error correction circuit (ECC circuit) for correcting errors in a memory system is used to correct errors occurring in memory cells and errors occurring when data are transferred during a read operation and a write operation of the memory system.

SUMMARY

Embodiments of the present invention are directed to decreasing the number of errors that may occur in error correction of a memory.

In accordance with an embodiment of the present invention, a memory includes: an error correction code generation circuit suitable for generating an M-bit error correction code based on a message including N data groups each of which includes K-bit data, where K, N and M are positive integers; a memory core including N+1 cell regions for storing the N data groups and the error correction code; and an error correction circuit suitable for correcting errors of the N data groups that are read from the memory core based on the error correction code that is read from the memory core, wherein the error correction code generation circuit generates the M-bit error correction code based on an $M \times [(K*N)+M]$ check matrix, wherein a message part of the check matrix includes N group indicators distinguishing the N data groups and N parts of bit indicators each of which distinguishes the K-bit data in a corresponding one of the N data groups, and wherein a hamming distance between the group indicators respectively corresponding to neighboring data groups among the N group indicators is 1 or M/2.

In accordance with another embodiment of the present invention, a method for operating a memory includes: receiving N data groups each of which includes K-bit data, where K and N are positive integers; generating an M-bit error correction code by using the N data groups as a message, where M is a positive integer; and storing the N data groups and the error correction code in N+1 cell regions of a memory core, wherein the M-bit error correction code is generated based on an $M \times [(K*N)+M]$ check matrix, wherein the message part of the check matrix includes N group indicators distinguishing the N groups, and N parts of bit indicators each of which distinguishes the K-bit data groups in a corresponding one of the N data groups, and wherein a hamming distance between the group indicators respectively corresponding to neighboring data groups among the N group indicators is 1 or M/2.

In accordance with yet another embodiment of the present invention, a memory includes: an error correction code generation circuit suitable for generating an 8-bit error correction code based on a message including 8 data groups each of which includes 16-bit data; a memory core including 9 cell regions for storing the 8 data groups and the error correction code; and an error correction circuit suitable for correcting errors of the 8 data groups that are read from the memory core based on the error correction code that is read from the memory core, wherein the error correction code generation circuit generates the 8-bit error correction code based on an $8 \times 136$ check matrix, wherein a message part of the check matrix includes 8 group indicators distinguishing the 8 data groups and 8 parts of bit indicators each of which distinguishes the 16-bit data in a corresponding one of the 8 data groups, and wherein a hamming distance between the group indicators respectively corresponding to neighboring data groups among the 8 group indicators is 1 or 4.

In accordance with still another embodiment of the present invention, a memory includes: an error correction code generation circuit suitable for generating an M-bit error correction code based on a message including N data groups each of which includes K-bit data, where K, N and M are positive integers; a memory core including N+1 cell regions for storing the N data groups and the error correction code; and an error correction circuit suitable for correcting errors of the N data groups that are read from the memory core based on the error correction code that is read from the memory core, wherein the error correction code generation circuit generates the M-bit error correction code based on an $M \times [(K*N)+M]$ check matrix, wherein a message part of the check matrix includes N group indicators distinguishing the N data groups and N parts of bit indicators each of which distinguishes the K-bit data in a corresponding one of the N data groups, and wherein a sum of the group indicators respectively corresponding to neighboring data groups among the N group indicators is different from any of the N group indicators.

In accordance with still another embodiment of the present invention, a memory includes: a memory core including sequentially disposed N data cell regions and an error correction code (ECC) cell region respectively suitable for storing N data pieces of K bits and a corresponding ECC of M bits; and an error correction circuitry suitable for generating the ECC based on the data pieces and error-correcting the data pieces based on the ECC, through a check matrix configured by a message part of a $[M \times (K*N)]$ bit-dimension and an ECC part of a $[M \times M]$ bit-dimension, wherein the message part includes N characteristic indicator groups of a $[M/2 \times K]$ bit-dimension, respectively corresponding to the data pieces, and each including K indicators of a $[M/2 \times 1]$ bit-dimension and having the same value, and wherein a hamming distance between the indicators respectively corresponding to the data pieces stored in neighboring ones among the data cell regions is 1 or M/2.

BRIEF DESCRIPTION OF THE DRAWINGS

FIG. 2 shows an example of a check matrix used by the error correction code generation circuit 110 and the error correction circuit 120.

FIG. 3 shows how the error correction code generation circuit 110 uses a check matrix.

FIG. 4 shows a result of the error correction code generation circuit 110 generating an error correction code ECC (0,1,1,0) for data DATA (1,1,0,0,1,0,1,0) by using the check matrix of FIG. 2.

FIG. 5 shows a process of the error correction circuit 120 correcting an error based on an error correction code ECC.

FIG. 6 shows another process of the error correction circuit 120 correcting an error based on an error correction code ECC.

FIG. 7 shows yet another process of the error correction circuit 120 correcting an error based on an error correction code ECC.

FIG. 9 shows an example of a check matrix used by the error correction code generation circuit 821 and the error correction circuit 822 of an ECC block 820 shown in FIG. 8.

FIG. 10 shows group indicators satisfying Rule (1) and Rule (2) in accordance with an embodiment of the present invention.

FIG. 11 shows group indicators satisfying Rule (1) and Rule (2) in accordance with another embodiment of the present invention.

DETAILED DESCRIPTION

Figure 1:
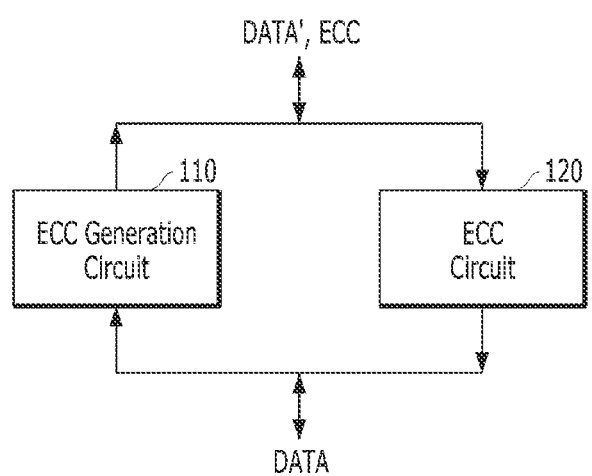
FIG. 1 is a block diagram illustrating an error correction code generation circuit 110 and an error correction circuit 120 in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating an error correction code generation circuit 110 and an error correction circuit 120 in accordance with an embodiment of the present invention.

The error correction code generation circuit 110 may generate an error correction code ECC based on data DATA transferred from the outside of the memory (transferred from a memory controller) during a write operation. That is, the error correction code generation circuit 110 may generate an error correction code ECC for correcting an error of the data DATA by encoding the data DATA. In the process of generating an error correction code ECC, the data to be encoded may also be called a message. During a write operation, the error correction code ECC is generated, but an error correction operation is not performed. Therefore, the data DATA input to the error correction code generation circuit 110 and the data DATA' output from the error correction code generation circuit 110 may be the same.

During a write operation, the data DATA' and the error correction code ECC may be stored in a memory core (not shown). Also, during a read operation, the data DATA' and the error correction code ECC may be read from the memory core and transferred to the error correction circuit 120.

During a read operation, the error correction circuit 120 may correct an error of the data DATA' based on the error correction code ECC. Here, "correcting an error" may mean detecting an error of the data DATA' by using the error correction code ECC and correcting it when an error is detected. The data DATA whose error is corrected by the error correction circuit 120 may be output to the outside of the memory. That is, the data DATA may be transferred to the memory controller. The error correction circuit 120 may correct not only an error occurring in the data DATA' but also an error occurring in the error correction code ECC.

The error correction code generation circuit 110 and the error correction circuit 120 may generate an error correction code ECC by using a check matrix, which is also called an H matrix, and correct an error based on the error correction code ECC. This will be described below.

FIG. 2 shows an example of a check matrix used by the error correction code generation circuit 110 and the error correction circuit 120. Here, for the sake of convenience in description, data has 8 bits D0 to D7 and an error correction code ECC has 4 bits E0 to E3.

The check matrix may be formed of a matrix of (the number of bits of the error correction code)×(the number of bits of an error correction code+the number of bits of a data). Here, since the error correction code is formed of 4 bits and the data is formed of 8 bits, the check matrix may be a 4×12 matrix. Each component of the check matrix may have a value of 1 or 0.

The column vectors of the check matrix may respectively correspond to the bits D0 to D7 of the data DATA and the bits E0 to E3 of the error correction code ECC. For example, among the 12 column vectors, 8 column vectors may correspond to the bits D0 to D7 of the data DATA, and 4 column vectors may correspond to the bits E0 to E3 of the error correction code ECC. In FIG. 2, it may be seen that 'D1' corresponds to a column vector having a value of '1101', and 'E2' corresponds to a column vector having a value of '0010'.

FIG. 3 shows how the error correction code generation circuit 110 uses the check matrix.

The error correction code generation circuit 110 may generate an error correction code ECC in such a manner that each of the column vectors of the check matrix is multiplied by the corresponding data bit or the corresponding ECC bit and then the sum of each row becomes 0 (which is an even number).

That is, an error correction code ECC may be generated to satisfy all of the following four equations.

$1*D0+1*D1+1*D2+0*D3+1*D4+1*D5+1*D6+1*D7+1*E0+0*E1+0*E2+0*E3=0$ [Equation 1]

$1*D0+1*D1+0*D2+1*D3+1*D4+0*D5+0*D6+1*D7+0*E0+1*E1+0*E2+0*E3=0$ [Equation 2]

$1*D0+0*D1+1*D2+1*D3+0*D4+1*D5+0*D6+1*D7+0*E0+0*E1+1*E2+0*E3=0$ [Equation 3]

$0*D0+1*D1+1*D2+1*D3+0*D4+0*D5+1*D6+1*D7+0*E0+0*E1+0*E2+1*E3=0$ [Equation 4]

FIG. 4 shows a result of the error correction code generation circuit 110 generating an error correction code ECC (0,1,1,0) for data DATA (1,1,0,0,1,0,1,0) by using the check matrix of FIG. 2.

When the data DATA (1,1,0,0,1,0,1,0) and the error correction code ECC (0,1,1,0) are put into the above four equations, it may be seen that they are satisfied as follows:

1*1+1*1+1*0+0*0+1*1+1*0+1*1+1*0+1*0+0*1+
0*1+0*0=0

1*1+1*1+0*0+1*0+1*1+0*0+0*1+1*0+0*0+1*1+
0*1+0*0=0

1*1+0*1+1*0+1*0+0*1+1*0+0*1+1*0+0*0+0*1+
1*1+0*0=0

0*1+1*1+1*0+1*0+0*1+0*0+1*1+1*0+0*0+0*1+
0*1+1*0=0

Equations 1 to 4 may also be used in a process that the error correction circuit 120 corrects an error of the data DATA and an error of the error correction code ECC based on the error correction code ECC. When the result of calculating the above four equations is Equation 1=0, Equation 2=0, Equation 3=0, and Equation 4=0, it may represent that there is no error within the data DATA. When there is a calculation result representing otherwise, it may represent that there is an error at the location represented by the calculation result.

FIG. 5 shows a process of the error correction circuit 120 correcting an error based on an error correction code ECC.

In FIG. 5 it is shown that an error occurs in which D6 is changed from 1 to 0 (1-40) among the data (1,1,0,0,1,0,1,0) so that the data DATA becomes (1,1,0,0, 1,0,0,0).

Calculating Equation 1-4 by putting the data DATA (1,1,0,0,1,0,0,0) having the error and the error correction code ECC (0,1,1,0) into the check matrix gives the following result.

1*1+1*1+1*0+0*0+1*1+1*0+1*0+1*0+1*0+0*1+
0*1+0*0=1

1*1+1*1+1*0+0*1+0*1+1*0+0*0+0*0+1*0+0*0+0*1+1*
0*1+0*0=0

1*1+0*1+1*0+1*0+0*1+1*0+0*0+0*1+1*0+0*0+0*1+
1*1+0*0=0

0*1+1*1+1*1+1*0+1*0+0*1+0*0+1*0+1*0+0*0+0*1+
0*1+1*0=1

In this result, 1,0,0,1 may represent the location of the error. Among the column vectors of the check matrix, the column vector having a value of 1,0,0,1 is a column vector corresponding to D6. Thus, the error correction circuit 120 may determine that there is an error in D6 and correct the error by inverting the value of D6 from 0 to 1 (0→1). That is, the error may be corrected.

FIG. 6 shows another process of the error correction circuit 120 correcting an error based on an error correction code ECC.

In this case, errors occur in D0 and D3 among the data (1,1,0,0,1,0,1,0) and the data DATA becomes (0,1,0,1,1,0, 1,0).

Calculating Equation 1-4 by putting the data DATA (0,1,0,1,1,0,1,0) having the errors and the error correction code ECC (0,1,1,0) into the check matrix gives the following result.

1*0+1*1+1*0+0*0+1*1+1*0+1*1+1*0+1*1+0*0+
0*1+0*0=1

1*0+1*1+1*0+0*0+1*1+1*1+1*0+0*0+0*0+1*0+0*0+0*1+1*
0*1+0*0=0

1*0+0*1+1*0+1*1+0*0+1*1+1*0+0*0+1*1+1*0+0*0+0*1+
1*1+0*0=0

0*0+1*1+1*0+1*1+0*1+1*0+0*1+1*1+1*0+0*0+0*1+
0*1+1*0=1

In this result, (1,0,0,1) may represent the location of the error, and the column vector having a value of 1,0,0,1 among the column vectors of the check matrix is a column vector corresponding to D6. Thus, the error correction circuit 120 may determine that there is an error in D6, and correct the error by inverting the value of D6 from 1 to 0 (1→0). As a result of the error correction, the data DATA may become (0,1,0,1,1,0,0,0). As shown above, when there are errors in 2 bits (D0 and D3) of the data DATA, the error correction circuit 120 cannot correct the errors and rather it may mis-correct D6 which is not erroneous and increase the number of errors to 3 bits. In this case, the error correction circuit 120 does not reduce the number of errors in the memory, but rather increases the number of errors.

FIG. 7 shows yet another process of the error correction circuit 120 correcting an error based on an error correction code ECC.

In FIG. 7 errors occur in D2 and D7 in the data (1,1,0, 0,1,0,1,0) and the data DATA becomes (1,1,1,0,1,0,1,1).

Calculating Equation 1-4 by putting the data DATA (1,1,1,0,1,0,1,1) including errors and the error correction code ECC (0,1,1,0) into the check matrix gives the following result.

1*1+1*1+1*1+1*0+0*1+1*0+1*1+1*1+1*0+0*1+
0*1+0*0=0

1*1+1*1+1*0+1*0+1*0+0*1+1*0+0*0+0*1+1*1+1*0+0*1+1*
0*1+0*0=1

1*1+0*1+1*1+1*1+0*0+1*1+1*0+0*0+1*1+1*0+0*0+0*1+
1*1+0*0=0

0*1+1*1+1*1+1*1+1*0+0*1+0*0+1*1+1*1+1*0+0*0+0*1+
0*1+1*0=0

In this result, (0,1,0,0) may represent the location of the errors, and the column vector having a value of 0,1,0,0 among the column vectors of the check matrix is a column vector corresponding to E1. Thus, the error correction circuit 120 may determine that there is an error in E1, and it may correct the error by inverting the value of E1 from 1 to 0 (1→0). As a result of the error correction, the data may be maintained as (1,1,1,0,1,0,1,1) and the error correction code ECC may become (0,0,1,0). That is, the errors in the two bits of the data DATA may not be corrected, and an error of one bit may be added to the error correction code ECC due to the mis-correction.

In this case, the mis-correction may occur only in the error correction code ECC and may not occur in the data DATA. Since the error correction code ECC is used only in an error correction operation and is not output to the outside of the memory, it may not affect the reliability of the system including the memory.

Although the number of errors increases due to the mis-correction of the error correction circuit 120 in both of the error correction processes of FIGS. 6 and 7, the errors increase in the data which affects the reliability of the memory in the case of FIG. 6, and the errors increase the error correction code ECC which does not affect the reliability of the system including the memory in the case of FIG. 7. In short, when the mis-correction can be made to occur not in the data DATA but in the error correction code ECC, the reliability of the memory system 100 may not be degraded.

Figure 8:
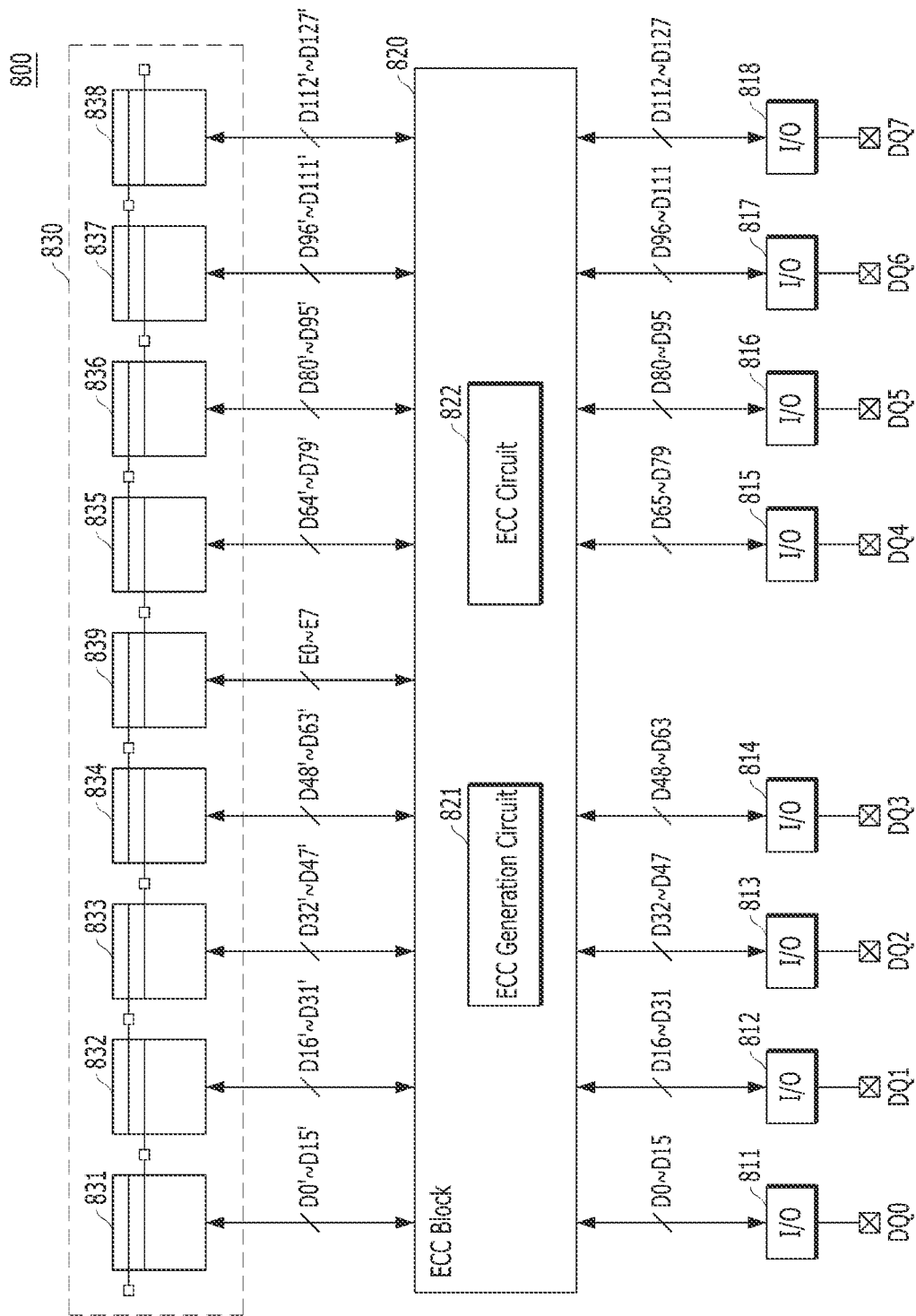
FIG. 8 is a block diagram illustrating a memory 800 in accordance with an embodiment of the present invention.

FIG. 8 is a block diagram illustrating a memory 800 in accordance with an embodiment of the present invention.

Referring to FIG. 8, the memory 800 may include data pads DQ0 to DQ7, data input/output circuits 811 to 818, an ECC block 820, and a memory core 830.

The data input/output circuits 811 to 818 may input/output a data D0 to D127 through the data pads DQ0 to DQ7. During a write operation, a 16-bit data may be input through one data pad, and during a read operation, a 16-bit data may be output through one data pad. Since there are eight data pads DQ0 to DQ7 in the memory 800, a 128-bit data D0 to D127 may be input to the memory 800 during a write operation, and a 128-bit data D0 to D127 may be output from the memory 800 during a read operation.

The ECC block 820 may include an error correction code generation circuit 821 and an error correction circuit 822. The error correction code generation circuit 821 may generate an 8-bit error correction code ECC based on the 128-bit data D0 to D127 received through the data input/output circuits 811 to 818 during a write operation. That is, the error correction code generation circuit 821 may generate an 8-bit error correction code ECC based on the 128-bit data D0 to D127 being used as a message. Since only the error correction code ECC is generated by the error correction code generation circuit 821 and no error correction operation is performed during the write operation, the data D0 to D127 input to the ECC block 820 and the data D0' to D127' output from the ECC block 820 may be the same.

The error correction circuit 822 may correct an error in the data D0' to D127' transferred from the memory core 830 based on the error correction code ECC transferred from the memory core 830. Here, correcting an error may mean detecting an error in the data D0' to D127' based on the error correction code ECC, and when an error is detected, correcting the error. The data input/output circuits 811 to 818 may output the data D0 to D127 whose errors are corrected by the error correction circuit 822 to the outside of the memory 800.

The memory core 830 may include a plurality of cell regions 831 to 839. The cell regions 831 to 838 and the data input/output circuits 811 to 818 may correspond 1:1. For example, the cell region 831 may store the data D0' to D15' received through the data input/output circuit 811, and the cell region 833 may store the data D32' to D47' received through the data input/output circuit 813. Also, the cell region 839 may store the error correction code ECC. Squares between the cell regions 831 to 839 may represent sub-word line drivers, and lines extending to the left and right of the sub-word line drivers may represent sub-word lines. Actually, there are a much larger number of sub-word line drivers and sub-word lines, but only some of them are shown here to simply show the structure. Since neighboring cell regions among the cell regions 831 to 839 share the sub-word line drivers, when an error occurs in a sub word line driver, an error is highly likely to occur in the cell regions on both sides of the sub-word line driver. For example, since the cell region 833 and the cell region 834 share a sub-word line driver, when an error occurs in the sub-word line driver which is shared by the cell regions 833 and 834, both of the cell regions 833 and 834 may be erroneous simultaneously.

In FIG. 8, the 128-bit data D0 to D127 are input/output to/from the memory 800 during a one-time write and read operation, and an 8-bit error correction code ECC is used. However, this is merely an example, and it may be apparent to those skilled in the art to which the present invention pertains that the number of bits of the data and the number of bits of the error correction code may be different from the example of FIG. 8.

Figure 9:
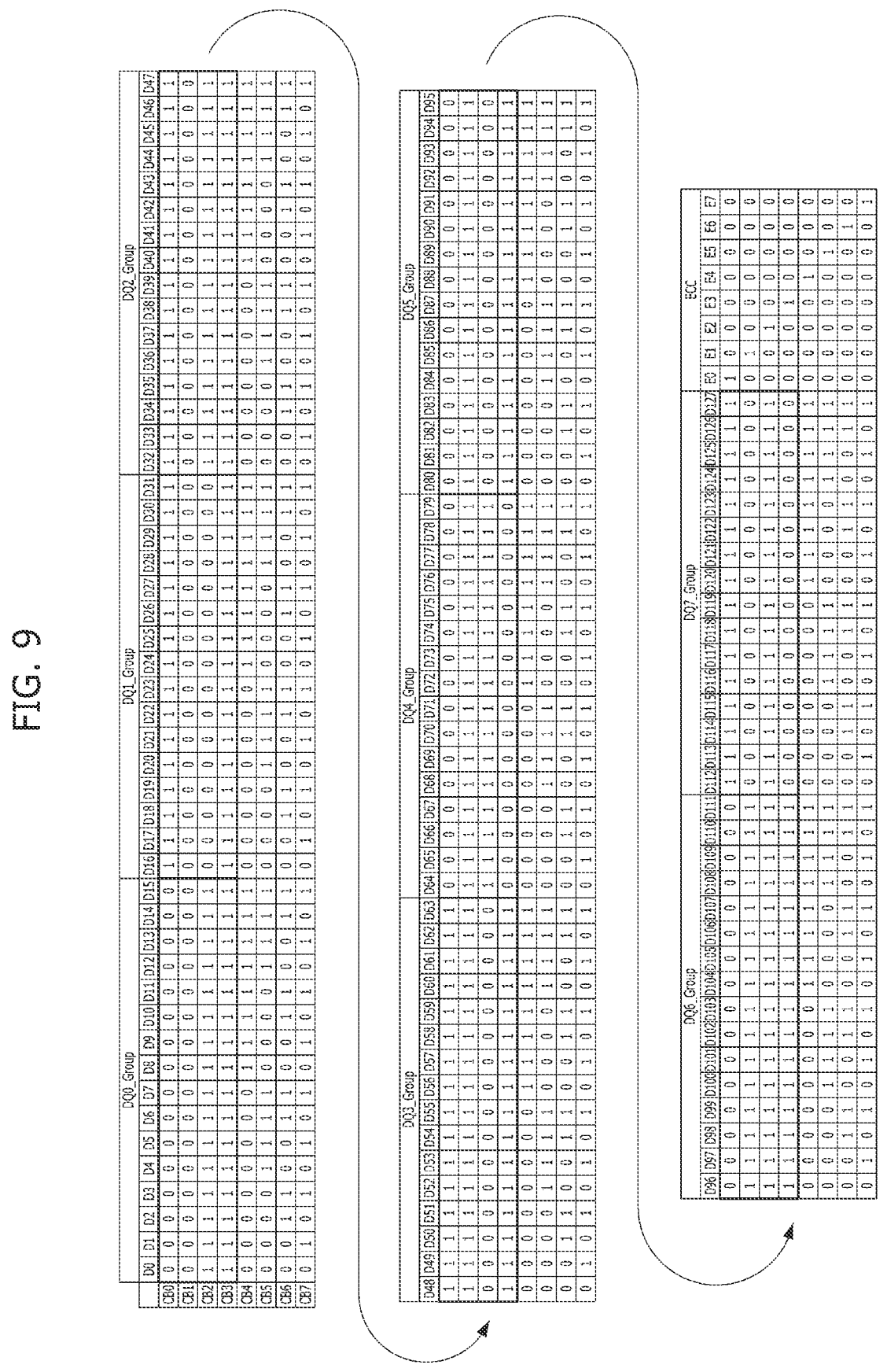

FIG. 9 shows an example of a check matrix used by the error correction code generation circuit 821 and the error correction circuit 822 of the ECC block 820 shown in FIG. 8.

The check matrix may be formed of a matrix of (the number of bits of the error correction code)×(the number of bits of the error correction code+the number of bits of the data). Here, since the error correction code is of 8 bits and the data is of 128 bits, the check matrix may be formed of an 8×136 matrix. Each component of the check matrix may have a value of 1 or 0.

A message D0 to D127 may be divided into eight data groups DQ0_Group to DQ7_Group. Here, the data received through the same data pad may be grouped into the same group. For example, the 16-bit data D0 to D15 received through the data pad DQ0 may belong to the data group DQ0_Group, and the 16-bit data D96 to D111 received through the data pad DQ6 may belong to the data group DQ6_Group.

In the check matrix, the message part may include 8 group indicators and 8 parts of bit indicators. In FIG. 9, the thick-line box corresponding to each of the data groups DQ0_Group to DQ7_Group may correspond to the group indicator of a corresponding data group. The 8 group indicators may correspond to the 8 data groups DQ0_Group to DQ7_Group, respectively. The 8 group indicators may discriminate the 8 data groups DQ0_Group to DQ7_Group. In FIG. 9, remaining bits other than the group indicators may be the 8 parts of bit indicators. The 8 parts may correspond to the data groups DQ0_Group to DQ7_Group, respectively. Each part of bit indicators may discriminate 16-bit data inside a corresponding data group of the 158 data groups DQ0_Group to DQ7_Group.

Referring to FIG. 9, D0 to D15 and CB0 to CB3 may be the group indicator of the data group DQ0_Group, and D0 to D15 and CB4 to CB7 may be the bit indicator of the data group DQ0_Group. Also, D32 to D47 and CB0 to CB3 may be the group indicator of the data group DQ2_Group, and D32 to D47 and CB4 to CB7 may be the bit indicator of the data group DQ2_Group. Referring to FIG. 9, it may be seen from the group indicators that all columns have the same value in the same group indicator. For example, all columns of the group indicator of the data group DQ3_Group may have a value of '1101', and all columns of the group indicator of the data group DQ5_Group may have a value of '0101'. Also referring to FIG. 9, it may be seen that the bit indicators have the same value in all data groups. For example, the 4×16 bit indicators corresponding to the data group DQ0_Group may have the same value as the 4×16 bit indicators corresponding to each of the other data groups DQ1_Group to DQ7_Group.

The error correction code generation circuit 821 and the error correction circuit 822 may generate an error correction code ECC based on the check matrix of FIG. 9 in the same manner as described in FIGS. 3 to 7, and correct errors in the data D0' to D127'.

When multiple errors occur only in one cell region among the cell regions 831 to 838, that is, when multiple errors occur only in one data group among the data groups DQ0_Group to DQ7_Group, mis-correction may not occur or may occur only in the data group. For example, when an even number of errors occur only in the data group DQ1_Group, the sum of the group indicators at the locations where the errors occur may be '0000' (e.g., 1001+1001=0000). Since there is no data group corresponding the group indicator '0000', mis-correction may not occur. Also, when an odd number of errors occur only in the data group DQ1_Group, the sum of the group indicators at the locations where the errors occur may become '1001' (e.g., 1001+1001+1001=1001). Thus, mis-correction may occur in the data group DQ1_Group. The increase in the number of errors caused by mis-correction in the data group in which the errors occur may not cause any problem in the reliability of the system. This is because it is possible to correct an error even though the number of errors increases in one symbol since the memory controller that controls the memory 800 recognizes each of the data groups DQ0_Group to DQ7_Group as one symbol and performs an error correction operation on the basis of a symbol.

Since the cell regions 831 to 839 share the sub-word line driver between the neighboring cell regions, there is a high possibility that errors occur simultaneously in the neighboring cell regions. For example, when an error occurs in the cell region 831, the cell region 832 is also highly likely to be erroneous as well. When an odd number of errors occur in the data group DQ0_Group corresponding to the cell region 831 and an odd number of errors occur in the data group DQ1_Group corresponding to the cell region 832, the sum of the two group indicators may be 0011+1001=1010. Thus, mis-correction may occur in the data group DQ7_Group corresponding to the group indicator '1010'. Since a new error occurs, due to mis-correction, in the data group DQ7_Group that does not have any error, this may greatly deteriorate the reliability of the system including the memory 800.

In order to increase the reliability of the system including the memory, the following conditions (A) and (B) have to be achieved.

Condition (A): When multiple errors occur in one data group, mis-correction should not occur or should occur only in the data group.

Condition (B): When an odd number of errors occur simultaneously in each of two data groups corresponding to two neighboring cell regions, mis-correction should not occur in the other data groups. Mis-correction may occur in the error correction code.

In order to achieve the above conditions (A) and (B), the check matrix may have to satisfy the following rules (1) and (2).

Rule (1): The check matrix should have the group indicators. As shown in FIG. 9, condition (A) may be achieved by the group indicators for distinguishing the data groups DQ0_Group to DQ7_Group. Due to the group indicators of the check matrix, mis-correction does not occur in one data group when an even number of errors occur in the data group and mis-correction occurs only in the data group when an odd number of errors occur in the data group.

Rule (2): The hamming distance between the group indicators respectively corresponding to the neighboring data groups should be 1 or 4 (that is, half the number of bits of the error correction code).

Here, the neighboring data groups may refer to data groups corresponding to the neighboring cell regions. For example, the data group DQ0_Group may correspond to the cell region 831, and the data group DQ1_Group may correspond to the cell region 832, but since the cell regions 831 and 832 are adjacent to each other, the data groups DQ0_Group and DQ1_Group may be neighboring data groups. However, the data group DQ3_Group may correspond to the cell region 834, and the data group DQ4_Group may correspond to the cell region 835, and the cell region 839 exists between the cell regions 834 and 835. Since the cell regions 834 and 835 are not adjacent to each other, the data groups DQ3_Group and DQ4_Group may not be neighboring data groups. Rule (2) may be a rule for ensuring that the sum of the group indicators of the neighboring data groups have a value that is different from that of any group indicator.

The check matrix of FIG. 9 may satisfy Rule (1) but may not satisfy Rule (2).

FIG. 10 shows group indicators satisfying Rule (1) and Rule (2) in accordance with an embodiment of the present invention. The part corresponding to the error correction code ECC in the check matrix and bit indicators may be the same as those shown in FIG. 9.

Referring to FIG. 10, it may be seen that a hamming distance between the group indicators (0,0,1,1) and (1,0,1,1) respectively corresponding to the neighboring data groups DQ0_Group and DQ1_Group is 1, and a hamming distance between the group indicators (1,0,1,1) and (1,0,0,1) respectively corresponding to the neighboring data groups DQ1_Group and DQ2_Group is 1, and a hamming distance between the group indicators (1,0,0,1) and (1,1,0,1) respectively corresponding to the neighboring data groups DQ2_Group and DQ3_Group is 1. Also, a hamming distance between the group indicators (0,1,1,0) and (0,1,1,1) respectively corresponding to the neighboring data groups DQ4_Group and DQ5_Group is 1, and a hamming distance between the group indicators (0,1,1,1) and (0,1,0,1) respectively corresponding to the neighboring data groups DQ5_Group and DQ6_Group is 1, and a hamming distance between the group indicators (0,1,0,1) and (1,0,1,0) respectively corresponding to the neighboring data groups DQ6_Group and DQ7_Group is 4.

When a group indicator is assigned as shown in FIG. 10, even though errors occur simultaneously in the neighboring data groups, reliability of the system may not be damaged.

When an odd number of errors occur in each of the neighboring data groups DQ0_Group and DQ1_Group, mis-correction may occur at the location represented by the sum of the group indicators of the data groups DQ0_Group and DQ1_Group, which is (0,0,1,1)+(1,0,1,1)=(1,0,0,0). Since (1,0,0,0) is the position of the error correction code E0, mis-correction may occur in the error correction code E0. Since the error correction code E0 is not output to the outside of the memory, mis-correction of the error correction code may have no effect on the reliability of the system including the memory.

Also, when an odd number of errors occur in each of the neighboring data groups DQ6_Group and DQ7_Group, mis-correction may occur at the location represented by the sum of the group indicators of the data groups DQ6_Group and DQ7_Group, which is (0,1,0,1)+(1,0,1,0)=(1,1,1,1). However, since a group indicator corresponding to (1,1,1,1) does not exist, mis-correction may not occur in the end.

As shown in FIG. 10, when group indicators are assigned to the data groups DQ0_Group to DQ7_Group, the reliability of the system including the memory 800 may be greatly improved.

FIG. 11 shows group indicators satisfying Rule (1) and Rule (2) in accordance with another embodiment of the present invention. The part corresponding to the error correction code ECC in the check matrix and the bit indicators may be the same as those in FIG. 9.

Referring to FIG. 11, it may be seen that a hamming distance between the group indicators (0,0,1,1) and (1,0,1,1) respectively corresponding to the neighboring data groups DQ0_Group and DQ1_Group is 1, and a hamming distance between the group indicators (1,0,1,1) and (1,0,0,1) respectively corresponding to the neighboring data groups DQ1_Group and DQ2_Group, is 1, and a hamming distance between the group indicators (1,0,0,1) and (0,1,1,0) respectively corresponding to the neighboring data groups DQ2_Group and DQ3_Group, is 4. Also, a hamming distance between the group indicators (0,1,1,1) and (0,1,0,1) respectively corresponding to the neighboring data groups DQ4_Group and DQ5_Group is 1, and a hamming distance between the group indicators (0,1,0,1) and (1,0,1,0) respectively corresponding to the neighboring data groups DQ5_Group and DQ6_Group is 1, and a hamming distance between the group indicators (1,0,1,0) and (1,1,1,0) respectively corresponding to the neighboring data groups DQ6_Group and DQ7_Group is 1.

In FIG. 11, since the group indicators of the data groups DQ0_Group to DQ7_Group are allocated to satisfy Rule (1) and Rule (2), when the group indicators are allocated to the data groups DQ0_Group to DQ7_Group as shown in FIG. 11, the reliability of the system including the memory 800 may be greatly improved.

According to the embodiments of the present invention, the number of errors that may occur in error correction of a memory may be decreased.

While the present invention has been described with respect to the specific embodiments, it will be apparent to those skilled in the art that various changes and modifications may be made without departing from the spirit and scope of the invention as defined in the following claims.

What is claimed is:

1. A memory, comprising:
an error correction code generation circuit configured to generate an M-bit error correction code based on a message including N data groups each of which includes K-bit data, where K, N and M are positive integers;
a memory core including N+1 cell regions for storing the N data groups and the error correction code; and
an error correction circuit configured to correct errors of the N data groups that are read from the memory core based on the M-bit error correction code that is read from the memory core,
wherein the error correction code generation circuit generates the M-bit error correction code based on a message for an M×[(K*N)+M] check matrix,
wherein the message of the M×[(K*N)+M] check matrix includes N group indicators distinguishing the N data groups, and N parts of bit indicators each of which distinguishes the K-bit data in a corresponding one of the N data groups, and
wherein a hamming distance between the N group indicators respectively corresponding to neighboring data groups among the N group indicators is 1 or M/2.

2. The memory of claim 1, wherein the neighboring data groups are the data groups stored in neighboring cell regions among the cell regions.

3. The memory of claim 2, wherein the neighboring cell regions share at least one sub-word line driver or more.

4. The memory of claim 1,
wherein each of the N group indicators has a size of (M/2)×K, and
wherein each of the N parts of bit indicators has a size of (M/2)×K.

5. The memory of claim 1, wherein each of the N data groups is input to the memory through a different data pad.

6. A method for operating a memory, comprising:
receiving N data groups each of which includes K-bit data, where K and N are positive integers;
generating an M-bit error correction code by using the N data groups as a message, where M is a positive integer; and
storing the N data groups and the M-bit error correction code in N+1 cell regions of a memory core,
wherein the M-bit error correction code is generated based on a message for an M×[(K*N)+M] check matrix,
wherein the message of the M×[(K*N)+M] check matrix includes N group indicators distinguishing the N groups, and N parts of bit indicators each of which distinguishes the K-bit data groups in a corresponding one of the N data groups, and
wherein a hamming distance between the N group indicators respectively corresponding to neighboring data groups among the N group indicators is 1 or M/2.

7. The method of claim 6, wherein the neighboring data groups are the data groups stored in neighboring cell regions among the cell regions.

8. The method of claim 7, wherein the neighboring cell regions share at least one sub-word line driver or more.

9. The method of claim 6,
wherein each of the N group indicators has a size of (M/2)×K, and
wherein each of the N parts of bit indicators has a size of (M/2)×K.

10. The method of claim 6, wherein the receiving includes receiving each of the N data groups through a different data pad.

11. The method of claim 6, further comprising correcting errors of the N data groups that are read from the memory core based on the error correction code that is read from the memory core.

12. A memory, comprising:
an error correction code generation circuit configured to generate an 8-bit error correction code based on a message including 8 data groups each of which includes 16-bit data;
a memory core including 9 cell regions for storing the 8 data groups and the 8-bit error correction code; and
an error correction circuit configured to correct errors of the 8 data groups that are read from the memory core based on the 8-bit error correction code that is read from the memory core,
wherein the error correction code generation circuit generates the 8-bit error correction code based on a message for an 8×136 check matrix,
wherein the message of the 8×136 check matrix includes 8 group indicators distinguishing the 8 data groups, and 8 parts of bit indicators each of which distinguishes the 16-bit data in a corresponding one of the 8 data groups, and
wherein a hamming distance between the 8 group indicators respectively corresponding to neighboring data groups among the 8 group indicators is 1 or 4.

13. The memory of claim 12, wherein the neighboring data groups are the data groups stored in neighboring cell regions among the cell regions.

14. The memory of claim 13, wherein the neighboring cell regions share at least one sub-word line driver or more.

15. The memory of claim 12,
wherein each of the 8 group indicators has a size of 4×16, and
wherein each of the 8 parts of bit indicators has a size of 4×16.

16. The memory of claim 12, wherein each of the 8 data groups is input to the memory through a different data pad.

17. A memory, comprising:
an error correction code generation circuit configured to generate an M-bit error correction code based on a message including N data groups each of which includes K-bit data, where K, N and M are positive integers;
a memory core including N+1 cell regions for storing the N data groups and the M-bit error correction code; and
an error correction circuit configured to correct errors of the N data groups that are read from the memory core based on the M-bit error correction code that is read from the memory core,
wherein the error correction code generation circuit generates the M-bit error correction code based on a message for an M×[(K*N)+M] check matrix,
wherein the message part of the M×[(K*N)+M] check matrix includes N group indicators distinguishing the N data groups, and N parts of bit indicators each of which distinguishes the K-bit data in a corresponding one of the N data groups, and
wherein a sum of the N group indicators respectively corresponding to neighboring data groups among the N group indicators is different from any of the N group indicators.

* * * * *